United States Patent
Zunft et al.

(10) Patent No.: US 10,843,917 B2
(45) Date of Patent: Nov. 24, 2020

(54) MICROMECHANICAL DEVICE HAVING A DECOUPLED MICROMECHANICAL STRUCTURE

(71) Applicant: Robert Bosch GmbH, Stuttgart (DE)

(72) Inventors: Steffen Zunft, Reutlingen (DE); Bonsang Kim, Mountain View, CA (US); Ando Feyh, Reutlingen (DE); Andrew Graham, Redwood City, CA (US); Gary O'Brien, Palo Alto, CA (US); Michael Baus, Bietigheim-Bissingen (DE); Ralf Maier, Gerlingen (DE); Mariusz Koc, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/480,015

(22) Filed: Apr. 5, 2017

(65) Prior Publication Data
US 2017/0305740 A1    Oct. 26, 2017
US 2019/0276305 A9    Sep. 12, 2019

Related U.S. Application Data

(63) Continuation-in-part of application No. 15/108,414, filed as application No. PCT/US2014/072694 on Dec. 30, 2014, now Pat. No. 10,317,211.
(Continued)

(30) Foreign Application Priority Data

Apr. 21, 2016    (DE) .................... 10 2016 206 791

(51) Int. Cl.
*B81B 7/00*       (2006.01)
*B81C 1/00*       (2006.01)

(52) U.S. Cl.
CPC .......... *B81B 7/0016* (2013.01); *B81B 7/0048* (2013.01); *B81C 1/00333* (2013.01);
(Continued)

(58) Field of Classification Search
CPC ................ B81B 7/0016; B81B 7/0058; B81B 2201/0235; B81C 1/00333
See application file for complete search history.

(56) References Cited

U.S. PATENT DOCUMENTS 6,458,615 B1 * 10/2002 Fedder ................ B81C 1/00246
                                                                    216/79
8,174,083 B1 *  5/2012 Waters ................ G01P 15/0802
                                                                    257/415

(Continued)

FOREIGN PATENT DOCUMENTS

WO    WO 2015103220 A1 *  7/2015    .......... G01P 15/0802

OTHER PUBLICATIONS

"Leak Rate Definition" from Vacuum Engineering. Accessed online Oct. 21, 2019. (Year: 2019).*

*Primary Examiner* — Cuong Q Nguyen
*Assistant Examiner* — Peter M Albrecht
(74) *Attorney, Agent, or Firm* — Norton Rose Fulbright US LLP; Gerard Messina

(57) ABSTRACT

A micromechanical device having a substrate wafer, a functional layer situated above it which has a mobile micromechanical structure, and a cap situated on top thereof, having a first cavity, which is formed at least by the substrate wafer and the cap and which includes the micromechanical structure. The micromechanical device has a fixed part and a mobile part, which are movably connected to each other with at least one spring element, and the first cavity is situated in the mobile part. Also described is a method for producing the micromechanical device.

11 Claims, 9 Drawing Sheets

Related U.S. Application Data

(60) Provisional application No. 61/921,927, filed on Dec. 30, 2013.

(52) U.S. Cl.
CPC ......... *B81B 2201/0235* (2013.01); *B81B 2201/0242* (2013.01); *B81B 2203/0163* (2013.01); *B81B 2203/0315* (2013.01); *B81C 2203/0109* (2013.01); *B81C 2203/0118* (2013.01)

(56) References Cited

U.S. PATENT DOCUMENTS

| | | | | |
|---|---|---|---|---|
| 2008/0282802 A1* | 11/2008 | Pike | ............... | G01P 15/08 73/514.32 |
| 2012/0160027 A1* | 6/2012 | Hsu | ............... | B81B 3/0086 73/504.08 |
| 2013/0181355 A1* | 7/2013 | Tsai | ............... | B81C 1/0023 257/774 |
| 2013/0341737 A1* | 12/2013 | Bryzek | ............... | H01L 29/84 257/415 |
| 2015/0111332 A1* | 4/2015 | Lee | ............... | B81C 1/00269 438/51 |

\* cited by examiner

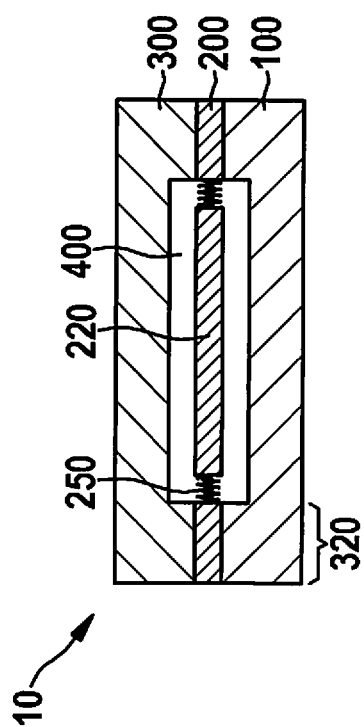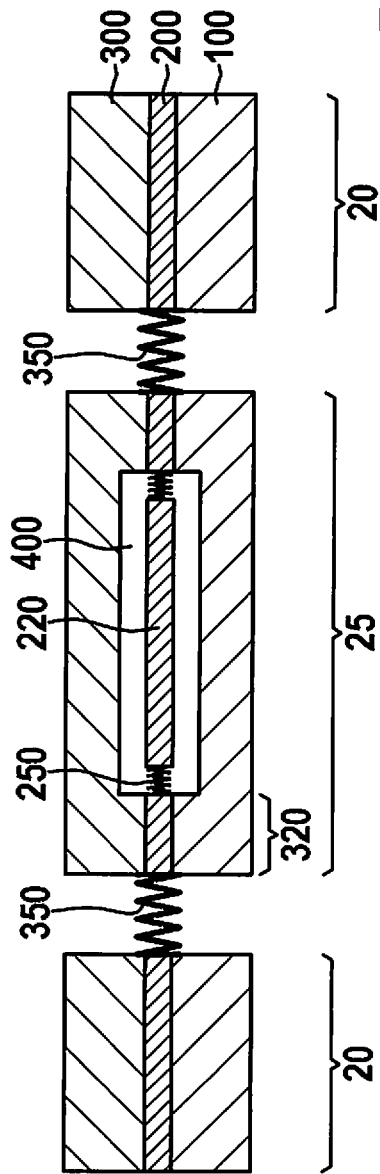

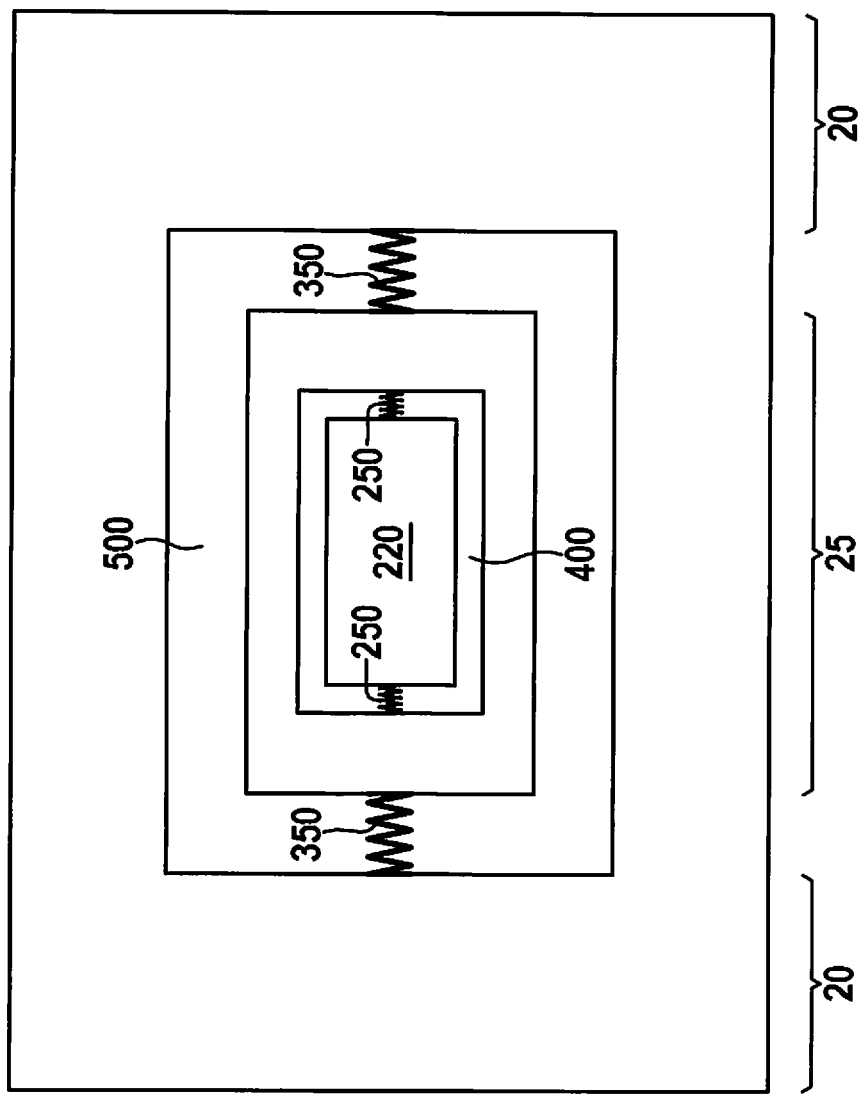

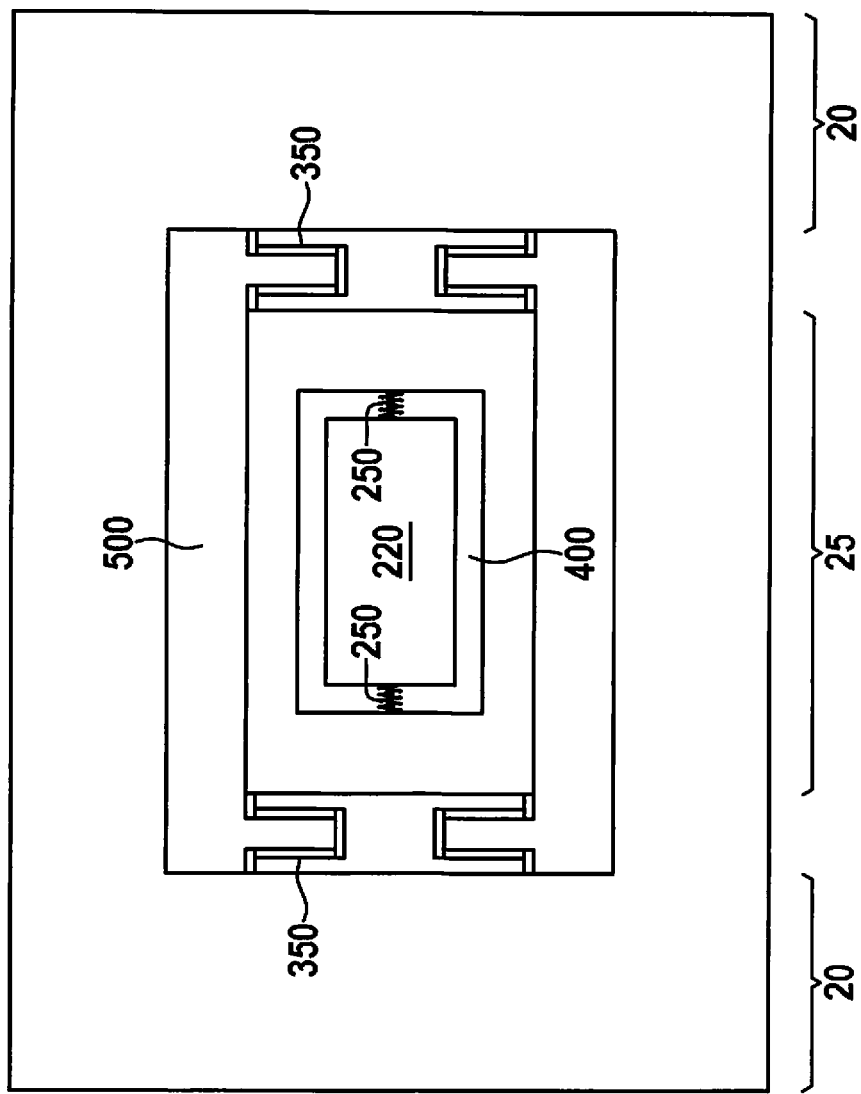

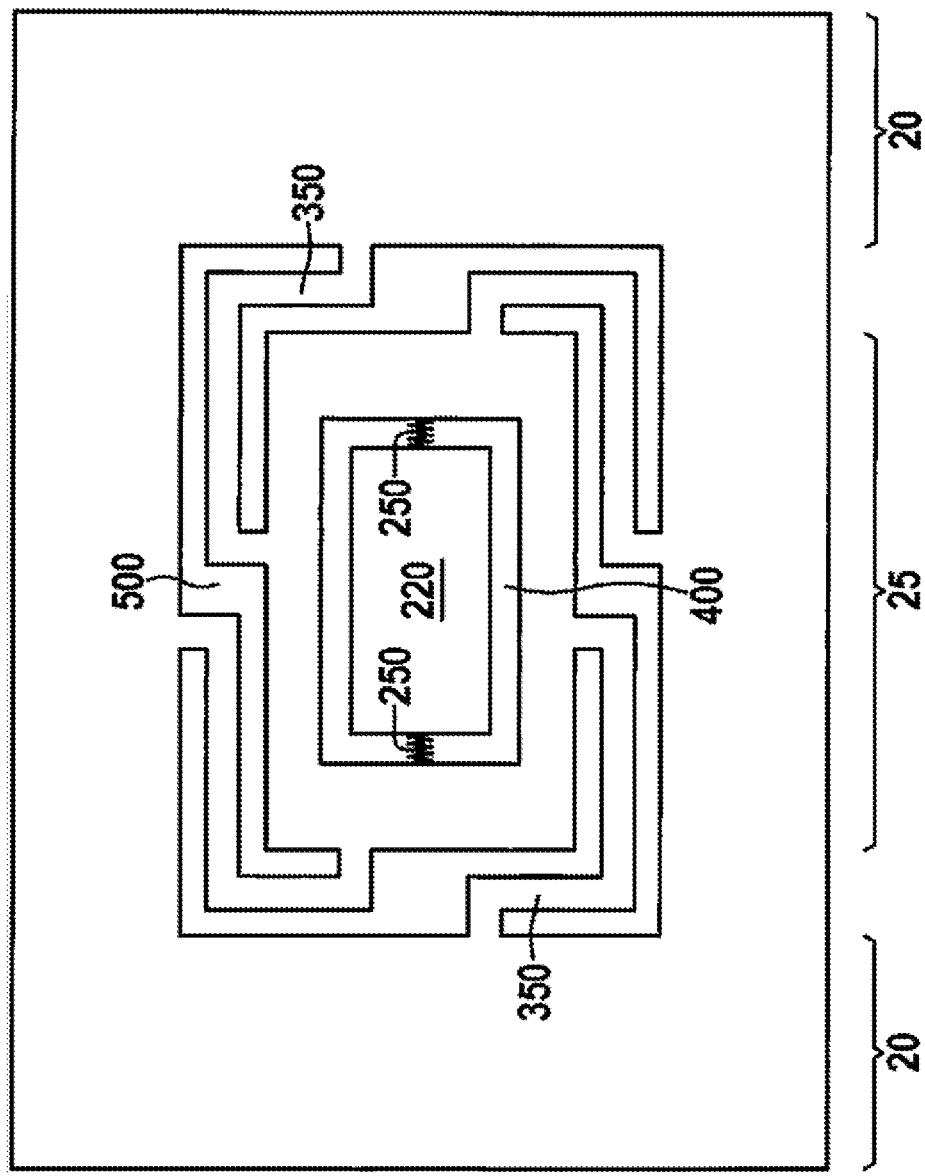

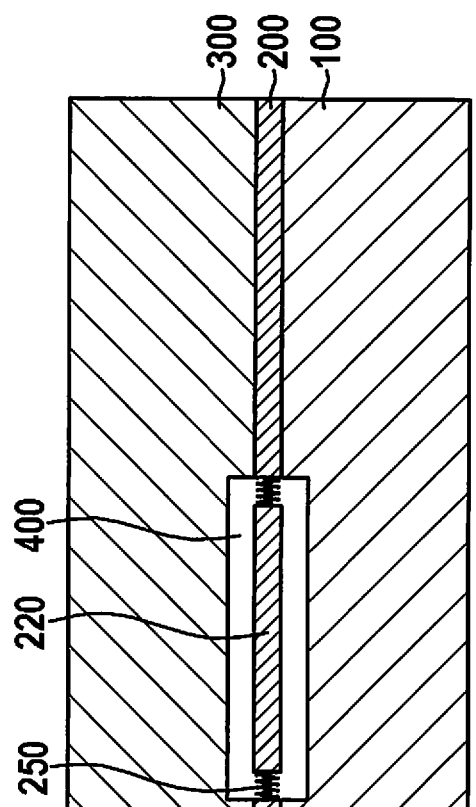
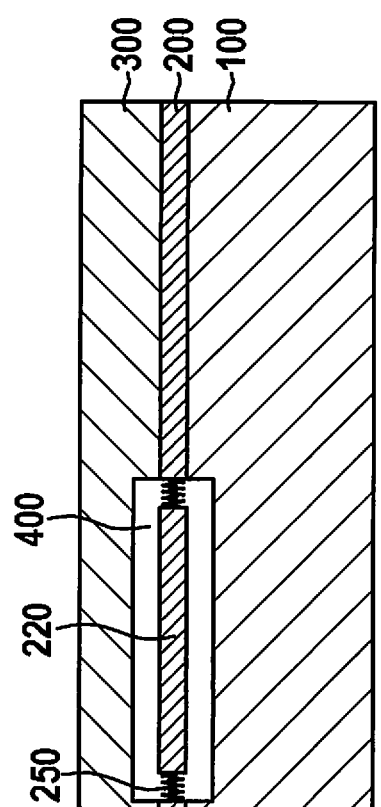
Fig. 6a
Fig. 6b

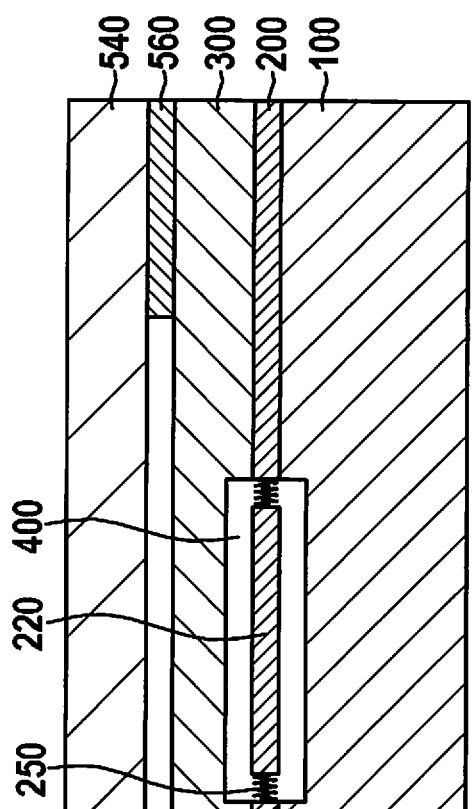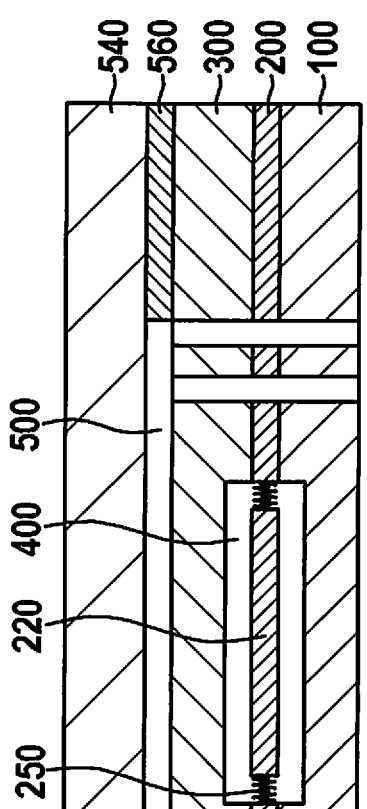

MICROMECHANICAL DEVICE HAVING A DECOUPLED MICROMECHANICAL STRUCTURE

The present application is a continuation-in-part of U.S. patent application Ser. No. 15/108,414, filed Jun. 27, 2014, which is the U.S. national stage of PCT/US2014/072694, filed Dec. 30, 2014, which claims the benefit, under 35 U.S.C. § 119(e), of U.S. Prov. Pat. App. Ser. No. 61/921,927, filed Dec. 30, 2013. The present application also claims priority to and the benefit of German patent application no. 10 2016 206 791.5, which was filed in Germany on Apr. 21, 2016, the disclosure of which is incorporated herein by reference.

RELATED APPLICATION INFORMATION

The present application claims priority to and the benefit of German patent application no. 10 2016 206 791.5, which was filed in Germany on Apr. 21, 2016, the disclosure of which is incorporated herein by reference.

FIELD OF THE INVENTION

The present invention is based on a micromechanical device having a substrate wafer, a functional layer disposed thereon that includes a mobile micromechanical structure, and having a cap situated on top thereof, as well as a first cavity, which is formed at least by the substrate wafer and the cap and includes the micromechanical structure.

BACKGROUND INFORMATION

Micromechanical sensors for measuring the yaw rate or acceleration are made up of at least one mobile structure, which is insulated from the external environment inside a cavity. In most instances the mobile structure is produced on a substrate wafer employing surface-micromechanical technology. The cavity is produced by placing a wafer cap on the substrate wafer. By their nature, micromechanical inertial sensors exhibit a sensitive response to vibrations, thrusts and other mechanical effects from the outside. To satisfy the requirement with regard to vibration sensitivity, for example, packaging that protects the actual sensor chip from vibrations with the aid of an external damping structure is therefore used. For the decoupling of mechanical stress that may lead to bending of the sensor chip and thus to faulty signals, soft adhesives are employed. The adhesives further limit the selection options for the packaging in terms of forms and materials. The connection region, i.e. the sealing frame or the bonding frame between the substrate wafer and the wafer cap, has a robust configuration, partially because of external media.

SUMMARY OF THE INVENTION

The present invention is intended to insulate the actual micromechanical device from external mechanical influences at the wafer level.

The present invention is based on a micromechanical device, which includes a substrate wafer, a functional layer disposed thereon that includes a mobile micromechanical structure, and a cap situated on top thereof, a first cavity, which is formed at least from the substrate wafer and from the cap and includes the micromechanical structure. The core of the present invention consists of the micromechanical device having a fixed part and a mobile part, which are movably connected to each other with the aid of at least one spring element, the first cavity being situated in the mobile part. In this way the mobile micromechanical structure is advantageously able to be mechanically decoupled and damped from its environment without the entire micromechanical device having to be decoupled and damped from its environment.

According to an advantageous further development of the present invention, the spring element is etched out of the functional layer or also out of the substrate wafer or also out of the cap.

This advantageously makes it possible to provide different rigidities, different locations of the micromechanical device, and different geometries in the configuration of the spring element.

In a particularly advantageous further development of the present invention, it is provided that the first cavity be situated within a second cavity. In an advantageous manner, the second cavity thus protects the first cavity from environmental influences.

According to an advantageous further development of the present invention, the second cavity is formed at least from the fixed part, from a first wafer cap, and a second wafer cap.

The present invention also relates to a method for producing a micromechanical device. This advantageously allows for a mechanical decoupling of the mobile micromechanical structure from its environment and for packaging at the wafer level as well as sealing from environmental influences.

The sensor chip in the related art is advantageously subdivided by processing the chip. Thus, a portion of the chip is exposed with the aid of a suitable process. This produces springs that allow for the free movement of the current sensor chip. In an especially advantageous development of the present invention, a second cavity, which encloses the first cavity, is produced with the aid of two additional wafer caps. The two cavities may have different fillings (e.g., gases having different pressures). The vibration decoupling through a suitable design of the connection springs, i.e. the at least one spring element, provides cost advantages in comparison with the damping used in the packaging. The overall system is able to be given a more advantageous packaging (ICP). A higher pressure in the external cavity in comparison with the internal cavity may have a positive effect on the damping. Because of the elastic suspension, mechanical stress no longer reaches the sensor element, which means that better stability of the sensor signals is able to be achieved. Stress decoupling requires less attention in the ICP. The external cavity has a buffer effect for media reaching the chip from the outside before such media begins to affect the functionality of the sensor core.

BRIEF DESCRIPTION OF THE DRAWINGS

FIG. 1 schematically shows a micromechanical device having a cavity in the related art.

FIG. 2 schematically shows a micromechanical device having a cavity that is micromechanically decoupled, in a first specific embodiment of the present invention.

FIGS. 5a, 5b and 5c schematically show a respective micromechanical device according to the present invention, which has a first cavity that is micromechanically decoupled by various springs and is situated inside a second cavity.

FIGS. 6a, 6b, 6c, 6d, and 6e show a method according to the present invention for producing a micromechanical device having two cavities, stacked inside one another, through a stack of four wafers.

DETAILED DESCRIPTION

Figure 3A:
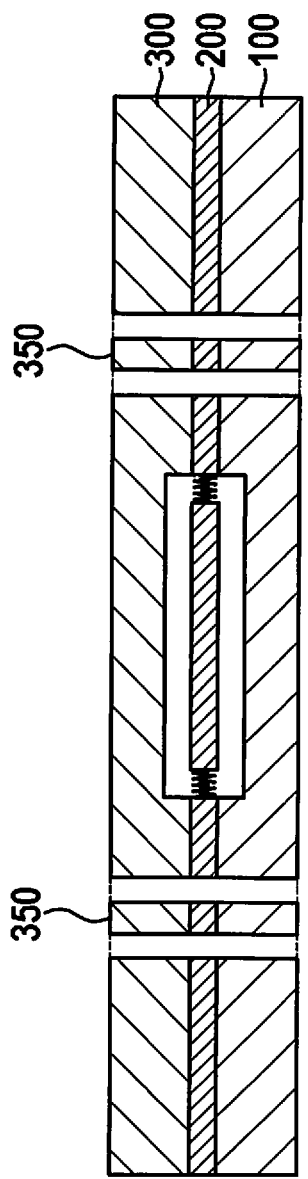
FIGS. 3a and b schematically show a respective micromechanical device according to the present invention, which includes a cavity that is micromechanically decoupled with the aid of various springs.

FIG. 1 shows a micromechanical device having a cavity in the related art. Shown is the schematic structure of a micromechanical device 10 in the form of a typical micromechanical yaw-rate or acceleration sensor. It is made up of at least one mobile micromechanical structure 220, which is produced in a functional plane 200 on substrate wafer 100. Micromechanical structure 220 is movably suspended with the aid of suspension springs 250. A wafer cap 300 protects this structure from the environment. A first cavity 400, inside which mobile structure 220 is situated, is formed between wafer cap 300 and substrate wafer 100. Wafer cap 300 and substrate wafer 100 are connected to each other with the aid of a sealing frame 320.

FIG. 2 schematically shows a micromechanical device having a cavity that is micromechanically decoupled, in a first specific embodiment of the present invention.

In contrast to the previously described micromechanical device in the related art, this micromechanical device according to the present invention includes a fixed part 20 and a mobile part 25, which are movably connected to each other with the aid of at least one spring element 350. First cavity 400 is situated in mobile part 25. In the exemplary embodiment at hand, mobile part 25 is exposed from fixed part 20 by trenches through the layer substructure in a region outside a sealing frame 320 of first cavity 400, the layer structure being made up of substrate 100, micromechanical functional layer 200 and cap 300. Elastic structures in the form of spring elements 350 are exposed as well, which connect mobile part 25 to fixed part 20. Substrate 100 may be a substrate wafer, in particular a silicon wafer. As an alternative, functional layer 200 also stands for a system of multiple layers. In this example, cap 300 is a wafer cap. As an alternative, however, cap 300 may also be realized as a thin-film cap, for example. The layer structure may alternatively also be a wafer stack.

Figure 3B:
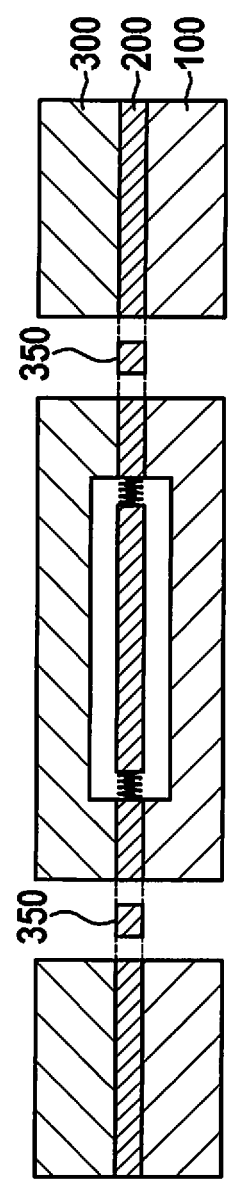

FIGS. 3a and b schematically show a respective micromechanical device according to the present invention, which includes a cavity that is micromechanically decoupled with the aid of various springs. Spring elements 350 may be made from different planes of the layer structure of substrate 100, functional layer 200 and cap 300, for instance from the entire layer structure or from the entire wafer stack, as shown in FIG. 3a. Spring elements 350, for example, may also consist of only micromechanical functional layer 200, as shown in FIG. 3b.

Figure 4:
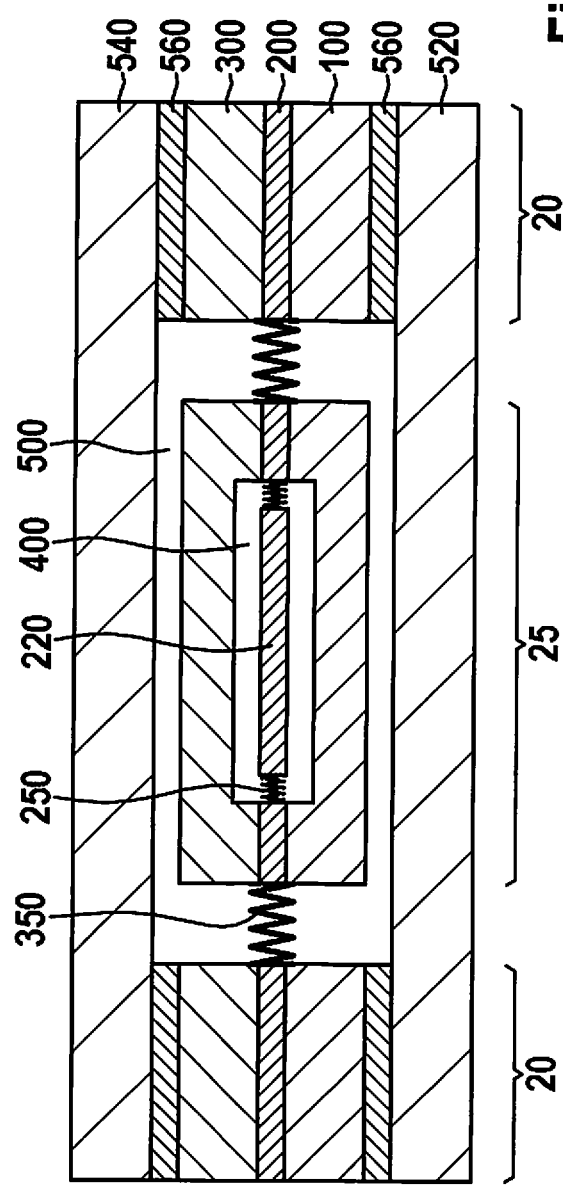
FIG. 4 schematically shows a micromechanical device having a first cavity, which is micromechanically decoupled and situated inside a second cavity, in a second specific embodiment of the present invention.

FIG. 4 schematically shows a micromechanical device having a first cavity, which is micromechanically decoupled and situated inside a second cavity in a second specific embodiment of the present invention. Shown is first cavity 400, which is situated inside second cavity 500. Second cavity 500 is bounded by a first external wafer cap 520 and a second external wafer cap 540. First external wafer cap 520 is situated on substrate 100 of fixed part 20 with the aid of spacer 560. Second external wafer cap 540 is situated on the layer of fixed part 20 that forms cap 300 on mobile part 25 with the aid of spacer 560. The two additional caps 520, 540 protect exposed first cavity 400 from the environment. Spacers 560 allow for a free movement of first cavity 400. For example, these spacers 560 may be made from the material of the cap or of the connection material for connecting the wafers, such as sealing glass.

FIGS. 5a, b, and c schematically show a respective micromechanical device according to the present invention, which has a first cavity which is micromechanically decoupled with the aid of various springs and situated inside a second cavity. The plan views are meant to represent possible placements and the structure of spring elements 350 by way of example. The basic system can be seen in FIG. 5a. To be added to the inner mobile micromechanical structure 220 only present as yet and which is disposed in first cavity 400 by suspension springs 250 is a second spring system having spring elements 350, which suspend mobile part 25 having first cavity 400 within second cavity 500 on fixed part 20. Possible developments of the spring elements can be gathered from FIGS. 5b and 5c.

According to FIG. 5b, for example, U-shaped springs 350 may be situated on four sides, disposed opposite one another, of mobile part 25 having first cavity 400, the springs extending through second cavity 500 and being connected to fixed part 20 at their other end.

FIG. 5c shows another possible setup, in which a respective multiply bent flexible spring 350 having a rectangular cross-section is situated at four sides of mobile part 25 including first cavity 400, the length of the springs utilizing the free intermediate space in second cavity 500.

As an alternative, it is also possible to provide only one spring element 350 (not shown).

FIGS. 6a through e show a method according to the present invention for producing a micromechanical device having two cavities, stacked inside each other, through a stack of four wafers.

There are various possibilities for implementing the present invention in a possible process sequence. In the following text, the sequence is to be outlined by way of example using a known process sequence for a current MEMS chip.

The starting point is a MEMS wafer having an inner mobile structure (FIG. 6a). MEMS wafer 600 includes a substrate wafer 100, a functional layer 200, and a wafer cap 300. They form first cavity 400, in which mobile micromechanical structure 220 is situated and suspended with the aid of suspension springs 250. Mobile micromechanical structure 220 and suspension springs 250 are etched out of functional layer 200.

First, cap 300 is thinned down from this MEMS wafer 600 from the direction of the top surface (FIG. 6b). Then, second wafer cap 540 is bonded with clearance to cap 300 using a spacer 560 (FIG. 6c). Spacer(s) 560, for example, may be made from the material of the cap or from the connection material for connecting the wafers, such as a sealing glass, which is also used for the bonding.

From the direction of the underside of substrate 100, current MEMS wafer then is initially thinned down and subsequently trenched (FIG. 6d). The configuration of the MEMS wafer must have uninterrupted silicon in the region of the new trench so that the trench will not be stopped. The trench is stopped in second cavity 500, which is already partially set up and bounded by wafer cap 540. On the one hand, mobile part 25 having first cavity 400 is exposed through the trench and thereby separated from fixed part 20. On the other, spring elements 350, which connect mobile part 25 and fixed part 20, are at least partially etched out. In the example at hand, spring elements 350 are made up of all three layers of the layer system, i.e. cap 300, functional layer 200, and substrate 100. Spring elements 350 are thus already completely etched out after the trenches have been introduced.

Figure 6E:
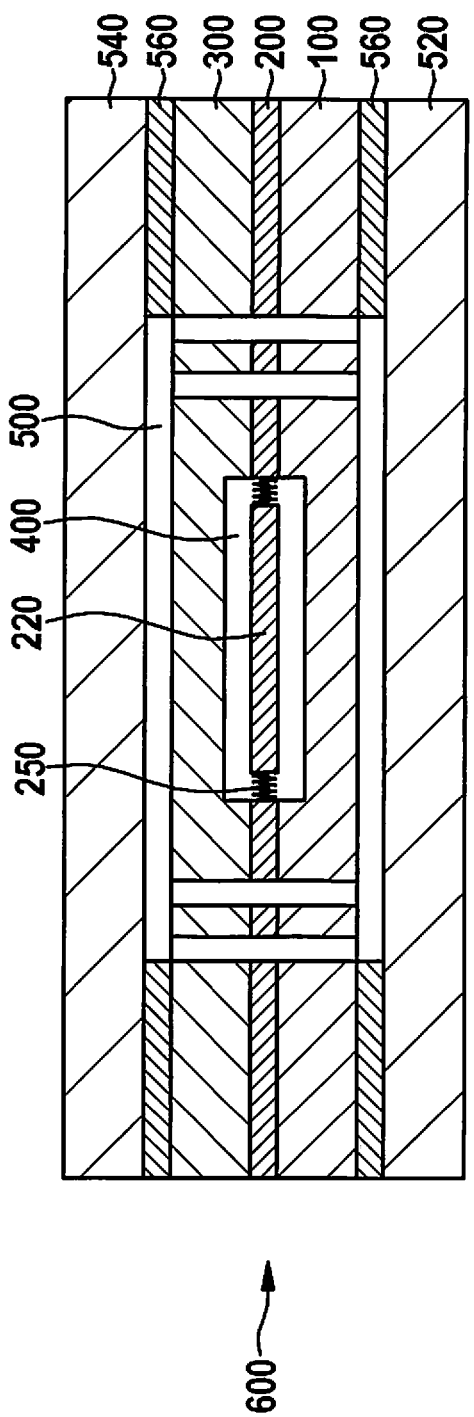

Now, first wafer cap 520 is bonded to substrate 100 in fixed part 20 (FIG. 6e).

At the end, electrical bond pads are optionally exposed by trenching through first external wafer cap (not shown).

In general terms, the method according to the present invention includes at least the following steps:
- (a) Providing a MEMS wafer 600 having a substrate wafer 100, a functional layer 200 disposed thereon which has a mobile micromechanical structure 220, and a cap 300 situated on top thereof, as well as a first cavity 400, which is formed at least by substrate wafer 100 and cap 300 and includes micromechanical structure 220.
- (b) Bonding a second wafer cap 540 to cap 300 with the aid of a spacer 560.
- (c) Trenching the MEMS wafer 600 from the direction of substrate wafer 100 and developing a fixed part 20 and a mobile part 25, first cavity 400 being situated in mobile part 25.
- (d) Bonding a first wafer cap 520 to substrate wafer 100 with the aid of a further spacer 560 and developing a second cavity 500, in which mobile part 25 having first cavity 400 is situated.

THE LIST OF REFERENCE NUMERALS IS AS FOLLOWS 10 micromechanical device
20 fixed part
25 mobile part
100 substrate
200 functional plane
220 mobile micromechanical structure
250 suspension springs
300 wafer cap
320 sealing frame
350 spring element
400 first cavity
500 second cavity
520 first wafer cap
540 second wafer cap
560 spacer
600 MEMS wafer

What is claimed is:

1. A micromechanical device, comprising:
a fixed part; and
a mobile part that includes:
   a housing that is externally connected to the fixed part by at least one spring element by which the housing is movable relative to the fixed part; and
   a micromechanical structure that is movable within an interior of, and relative to, the housing;
wherein:
   the housing is formed, at least in part, of a substrate wafer and a housing cap;
   the micromechanical structure is suspended within a first cavity that is formed (a) in the interior of the housing and (b) at least in part by the substrate wafer and the housing cap;
   an interior space of the fixed part forms a second cavity within which the mobile part is suspended; and
   the first cavity and the second cavity are formed such that, at a moment of completion of manufacture of the micromechanical device, a pressure in the first cavity is different than a pressure in the second cavity.

2. The micromechanical device of claim 1, wherein the micromechanical structure is formed of a functional layer that (a) is sandwiched between the substrate wafer and the housing cap and (b) also forms a part of the housing.

3. The micromechanical device of claim 1, wherein the fixed part is formed at least in part from the substrate wafer, a layer of which the housing cap is formed, a first external wafer cap, and a second external wafer cap.

4. The micromechanical device of claim 2, wherein the at least one spring element is etched out of at least one of the functional layer, the substrate wafer, and the housing cap.

5. The micromechanical device of claim 1, wherein the pressure in the first cavity is lower than the pressure in the second cavity.

6. The micromechanical device of claim 1, wherein the mobile part is arranged within the fixed part.

7. The micromechanical device of claim 1, wherein the mobile part is a sensor.

8. The micromechanical device of claim 1, wherein the mobile part is an acceleration sensor.

9. The micromechanical device of claim 2, wherein the at least one spring element is etched out of, and includes a portion of each of, the functional layer, the substrate wafer, and the housing cap.

10. The micromechanical device of claim 1, wherein the at least one spring element includes a respective U-shaped spring at each of four corners of the mobile part.

11. The micromechanical device of claim 1, wherein:
an exterior of the mobile part includes a first side, a second side, a third side, and a fourth side;
the first side extends between, and perpendicular to, the second side and the fourth side;
the second side extends between, and perpendicular to, the first side and the third side;
the third side extends between, and perpendicular to, the second side and the fourth side;
the fourth side extends between first side and the third side;
the fixed part includes:
   a first interior side that faces and extends parallel to the first side of the mobile part;
   a second interior side that faces and extends parallel to the second side of the mobile part;
   a third interior side that faces and extends parallel to the third side of the mobile part; and
   a fourth interior side that faces and extends parallel to the fourth side of the mobile part; and
the at least one spring element includes:
   a first spring arm that extends from a first end of the first spring arm that is attached to the first side of the mobile part to a second end of the first spring arm that is attached to the second interior side of the fixed part;
   a second spring arm that extends from a first end of the second spring arm that is attached to the second side of the mobile part to a second end of the second spring arm that is attached to the third interior side of the fixed part;
   a third spring arm that extends from a first end of the third spring arm that is attached to the third side of the mobile part to a second end of the third spring arm that is attached to the fourth interior side of the fixed part; and a fourth spring arm that extends from a first end of the fourth spring arm that is attached to the fourth side of the mobile part to a second end of the fourth spring arm that is attached to the first interior side of the fixed part.

* * * * *